United States Patent
Hu (10) Patent No.: US 10,523,470 B1
(45) Date of Patent: Dec. 31, 2019

(54) APPARATUS FOR PERFORMING BASELINE WANDER CORRECTION

(71) Applicant: Faraday Technology Corp., Hsin-Chu (TW)

(72) Inventor: Chia-Lin Hu, Hillsboro, OR (US)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 16/286,511

(22) Filed: Feb. 26, 2019

(30) Foreign Application Priority Data

Jul. 19, 2018 (TW) .............................. 107124930 A (51) Int. Cl.
*H04M 7/12* (2006.01)
*H04L 25/02* (2006.01)
*H03F 3/45* (2006.01)
*H03F 3/68* (2006.01)
*H04L 25/06* (2006.01)

(52) U.S. Cl.
CPC ..... *H04L 25/0276* (2013.01); *H03F 3/45192* (2013.01); *H03F 3/45269* (2013.01); *H03F 3/68* (2013.01); *H04L 25/06* (2013.01); *H03F 2200/129* (2013.01); *H03F 2203/45116* (2013.01); *H03F 2203/45241* (2013.01); *H04M 7/125* (2013.01)

(58) Field of Classification Search
USPC .................................. 375/318; 320/107, 146
See application file for complete search history.

(56) References Cited

U.S. PATENT DOCUMENTS

| | | | |
|---|---|---|---|
| 6,140,857 A | 10/2000 | Bazes | |
| 7,489,740 B2 | 2/2009 | Yen | |
| 7,961,817 B2 | 6/2011 | Dong | |
| 8,198,857 B2 * | 6/2012 | De Cremoux | G05F 1/56 320/107 |
| 8,568,329 B2 | 10/2013 | Lee | |
| 9,800,218 B1 * | 10/2017 | Rasmus | H03F 3/45183 |
| 10,038,574 B2 * | 7/2018 | Islam | H04L 25/03057 |
| 2016/0080176 A1 | 3/2016 | Kotagiri | |
| 2017/0093525 A1 | 3/2017 | Navid | |
| 2019/0140768 A1 * | 5/2019 | Navid | H04L 25/0272 |
| 2019/0207789 A1 * | 7/2019 | Kim | H03K 5/007 |

FOREIGN PATENT DOCUMENTS

TW 201223175 A1 6/2012

* cited by examiner

*Primary Examiner* — Eva Y Puente
(74) *Attorney, Agent, or Firm* — Winston Hsu (57) ABSTRACT

An apparatus for performing baseline wander correction is provided. The apparatus may include: a plurality of filters, a common mode voltage generator, and a compensation circuit. The plurality of filters may filter a set of input signals to generate a set of differential signals, the common mode voltage generator may generate a common mode voltage between the set of differential signals, and the compensation circuit may perform compensation related to baseline wander correction on the set of differential signals. Multiple current paths of the compensation circuit are associated with each other. Through a first current path and a second current path within the current paths, the compensation circuit may perform charge or discharge control on a first capacitor and a second capacitor within the plurality of filters to dynamically adjust compensation amounts of the compensation, to reduce or eliminate a baseline wander effect of the set of differential signals.

10 Claims, 5 Drawing Sheets

APPARATUS FOR PERFORMING BASELINE WANDER CORRECTION

BACKGROUND OF THE INVENTION

1. Field of the Invention

The present invention is related to signal processing, and more particularly, to an apparatus for performing baseline wander correction.

2. Description of the Prior Art

According to related arts, Serializer/Deserializer (SerDes) architecture can be applied to data transmission, such as high speed data transmission between multiple circuits or devices performed through limited number of input/output terminals. In a situation where the SerDes architecture is not properly designed, there may be some problems. For example, a SerDes receiver front-end circuit may have some filters for filtering undesired low frequency signals. When an input signal of the SerDes receiver front-end circuit carries a series of data such as consecutive logic values 0 or consecutive logic values 1 for a long period, these filters may introduce baseline wander effect. Some suggestions are provided in the related arts for trying to reduce this effect, but additional problems such as some side effects (e.g. complexity of circuit architecture, low efficiency, low speed, additional data processing, and so on) may be introduced. Thus, a novel architecture is needed, to improve overall performance without introducing any side effect or in a way that is less likely to introduce a side effect.

SUMMARY OF THE INVENTION

An objective of the present invention is to provide an apparatus for performing baseline wander correction, to solve the aforementioned problems.

Another objective of the present invention is to provide an apparatus for performing baseline wander correction, to improve overall performance without introducing any side effect or in a way that is less likely to introduce a side effect.

At least one embodiment of the present invention provides an apparatus for performing baseline wander correction, wherein the apparatus is applicable to a front-end circuit of a receiver. The apparatus may comprise a plurality of filters, a common mode voltage generator and a compensation circuit, which are positioned in the front-end circuit. The plurality of filters are coupled to a set of input terminals of the receiver, and may be arranged to filter a set of input signals on the set of input terminals to generate a set of differential signals on a set of secondary terminals for further use of the receiver. In addition, the common mode voltage generator is electrically connected to the set of secondary terminals, and may be arranged to generate a common mode voltage between the set of differential signals. Additionally, the compensation circuit is electrically connected to the set of secondary terminals, and may be arranged to perform compensation related to baseline wander correction on the set of differential signals. For example, multiple current paths of the compensation circuit are associated with each other. Through a first current path and a second current path within the current paths, the compensation circuit may perform charge or discharge control on a first capacitor and a second capacitor within the plurality of filters to dynamically adjust compensation amounts of the compensation, to reduce or eliminate a baseline wander effect of the set of differential signals.

One of advantages of the present invention is, the apparatus of the present invention can perform processing that is focusing on a receiver input common mode voltage while reducing or eliminating a baseline wander effect, having no need to worry about additional problems such as some side effects in the related arts. For example, the compensation circuit is not directly connected to the set of input terminals. In this situation, implementing the receiver according to the present invention can make it easier to optimize the range of the input common mode voltage and reduce power consumption. In addition, the apparatus of the present invention can directly compensate the input common mode voltage, and more particularly, perform real-time compensation through analog signals, rather than perform non-real-time processing through digital circuits. In comparison with the related arts, the apparatus of the present invention can perform baseline wander correction more efficiently and more quickly. The present invention can improve overall performance without introducing any side effect or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
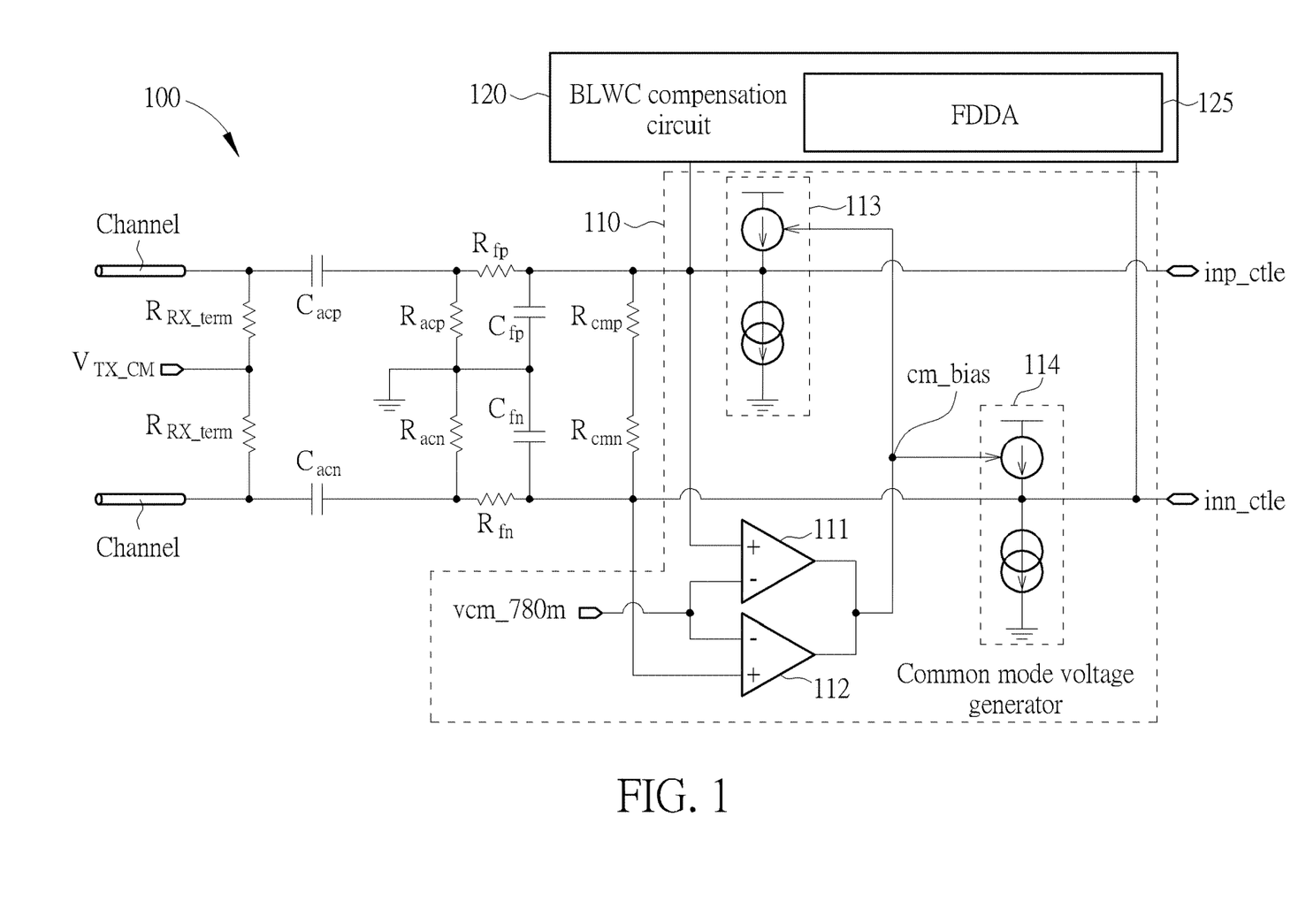
FIG. 1 is a diagram illustrating an apparatus for performing baseline wander correction according to an embodiment of the present invention.

FIG. 1 is a diagram illustrating an apparatus for performing baseline wander correction according to an embodiment of the present invention, where the apparatus is applicable to a front-end circuit of a receiver 100. Example of the receiver 100 may include, but are not limited to: a receiver in a Serializer/Deserializer (SerDes) architecture (which may be referred to as SerDes receiver). The apparatus may comprise a plurality of filters (e.g. multiple passive components such as multiple capacitors $\{C_{acp}, C_{acn}, C_{fp}, C_{fn}\}$ and multiple resistors $\{R_{acp}, R_{acn}, R_{fp}, R_{fn}, R_{cmp}, R_{cmn}, \{R_{RX\_term}\} \}$), and may comprise a common mode voltage generator 110 and a compensation circuit such as a baseline wander correction (BLWC) compensation circuit 120, where the common mode voltage generator 110 may comprise a set of operational amplifiers 111 and 112 and a set of adjustment circuits 113 and 114, the BLWC compensation circuit 120 may comprise a fully differential difference amplifier (FDDA) 125, and the plurality of filters, the common mode voltage generator 110 and the compensation circuit such as the BLWC compensation circuit 120 may be positioned in the front-end circuit, but the present invention is not limited thereto. For better comprehension, in some embodiments, associated parameter of a component may be expressed with the name of the component in italics, and/or a signal on a terminal may be expressed with the name of the terminal in italics.

According to the embodiment, the plurality of filters such as the capacitors $\{C_{acp}, C_{acn}, C_{fp}, C_{fn}\}$ and the resistors $\{R_{acp}, R_{acn}, R_{fp}, R_{fn}, R_{cmp}, R_{cmn}, \{R_{RX\_term}\}\}$ are coupled to a set of input terminals of the receiver, such as the upper and lower terminals of a set of resistors $\{R_{RX\_term}\}$ (which may have the same resistance $R_{RX\_term}$) that are coupled to the channels shown in FIG. 1, and may be arranged to filter a set of input signals on the set of input terminals to generate a set of differential signals on a set of secondary terminals $\{inp\_ctle, inn\_ctle\}$ for further use of the receiver. In addition, the common mode voltage generator 110 is electrically connected to the set of secondary terminals $\{inp\_ctle, inn\_ctle\}$, and may be arranged to generate a common mode voltage between the set of differential signals. For example, the apparatus may control the common mode voltage to be equal to a reference voltage level such as a voltage level Vcm, where the voltage level Vcm may be inputted into a reference voltage terminal such as a terminal vcm_780*m*, but the present invention is not limited thereto. Additionally, the compensation circuit such as the BLWC compensation circuit 120 is electrically connected to the set of secondary terminals $\{inp\_ctle, inn\_ctle\}$, and may be arranged to perform compensation related to baseline wander correction (BLWC) on the set of differential signals. For example, multiple current paths of the compensation circuit are associated with each other. More particularly, through a first current path and a second current path within the multiple current paths, such as current paths passing through connection wires between the common mode voltage generator 110 and the BLWC compensation circuit 120, respectively, the compensation circuit may perform charge or discharge control on the capacitors $C_{acp}$ and $C_{acn}$ within the plurality of filters to dynamically adjust compensation amounts of the compensation, to reduce or eliminate a baseline wander effect of the set of differential signals.

As shown in FIG. 1, the capacitor $C_{acp}$ is coupled between a first input terminal (such as the upper terminal of the set of resistors $\{R_{RX\_term}\}$, i.e. the terminal above the set of resistors $\{R_{RX\_term}\}$) within the set of input terminals and the secondary terminal inp_ctle within the set of secondary terminals $\{inp\_ctle, inn\_ctle\}$, and the capacitor $C_{acp}$ has a first terminal and a second terminal (such as the left-side and the right-side terminals thereof) that are coupled to the first input terminal and the secondary terminal inp_ctle, respectively. In addition, the capacitor $C_{acn}$ is coupled between a second input terminal (such as the lower terminal of the set of resistors $\{R_{RX\_term}\}$, i.e. the terminal below the set of resistors $\{R_{RX\_term}\}$) within the set of input terminals and the secondary terminal inn_ctle within the set of secondary terminals $\{inp\_ctle, inn\_ctle\}$, and the capacitor $C_{acn}$ has a first terminal and a second terminal that are coupled to the second input terminal and the secondary terminal inn_ctle, respectively. Regarding the BLWC compensation circuit 120, the first current path is coupled to the capacitor $C_{acp}$ through the second terminal of the capacitor $C_{acp}$ (such as the right-side terminal thereof), rather than through the first terminal of the capacitor $C_{acp}$ (such as the left-side terminal thereof), and the second current path is coupled to the capacitor $C_{acn}$ through the second terminal of the capacitor $C_{acn}$ (such as the right-side terminal thereof), rather than through the first terminal of the capacitor $C_{acn}$ (such as the left-side terminal thereof). The BLWC compensation circuit 120 is not directly connected to the set of input terminals (or the respective first terminals of the capacitors $C_{acp}$ and $C_{acn}$). In a situation where there is no need to consider a transmitter common mode voltage (such as a voltage level on a terminal $V_{TX\_CM}$), implementing the receiver 100 according to this architecture can make it easier to optimize the range of an input common mode voltage (such as the aforementioned common mode voltage) and reduce power consumption.

In addition, respective input terminals of the operational amplifiers 111 and 112 are electrically connected to each other, and are electrically connected to a common output terminal (such as a terminal cm bias). Respective first input terminals of the operational amplifiers 111 and 112 (such as inverting input terminals labeled "−" respectively) are electrically connected to each other and are electrically connected to a reference voltage (such as the reference voltage level on the terminal vcm_780*m*), and respective second input terminals of the operational amplifiers 111 and 112 (such as non-inverting input terminals labeled "+" respectively) are electrically connected to the secondary terminals inp_ctle and inn_ctle, respectively. The set of adjustment circuits 113 and 114 are electrically connected to the secondary terminals inp_ctle and inn_ctle, respectively, and are electrically connected to the set of operational amplifiers 111 and 112 through the common output terminal (such as the terminal cm bias). According to a voltage level on the common output terminal (such as a common mode bias voltage cm bias on the terminal cm bias), the adjustment circuits 113 and 114 may apply the common mode voltage to the set of differential signals.

According to some embodiments, the apparatus may comprise transistors, and the transistors may be implemented as Metal Oxide Semiconductor Field Effect Transistor (MOSFETs) such as P-type MOSFETs and N-type MOSFETs. For better comprehension, the beginning characters of a symbol of a certain transistor within the transistors may be "PM" or "NM", to indicate that this transistor is a P-type MOSFET or an N-type MOSFET, but the present invention is not limited thereto.

Figure 2:
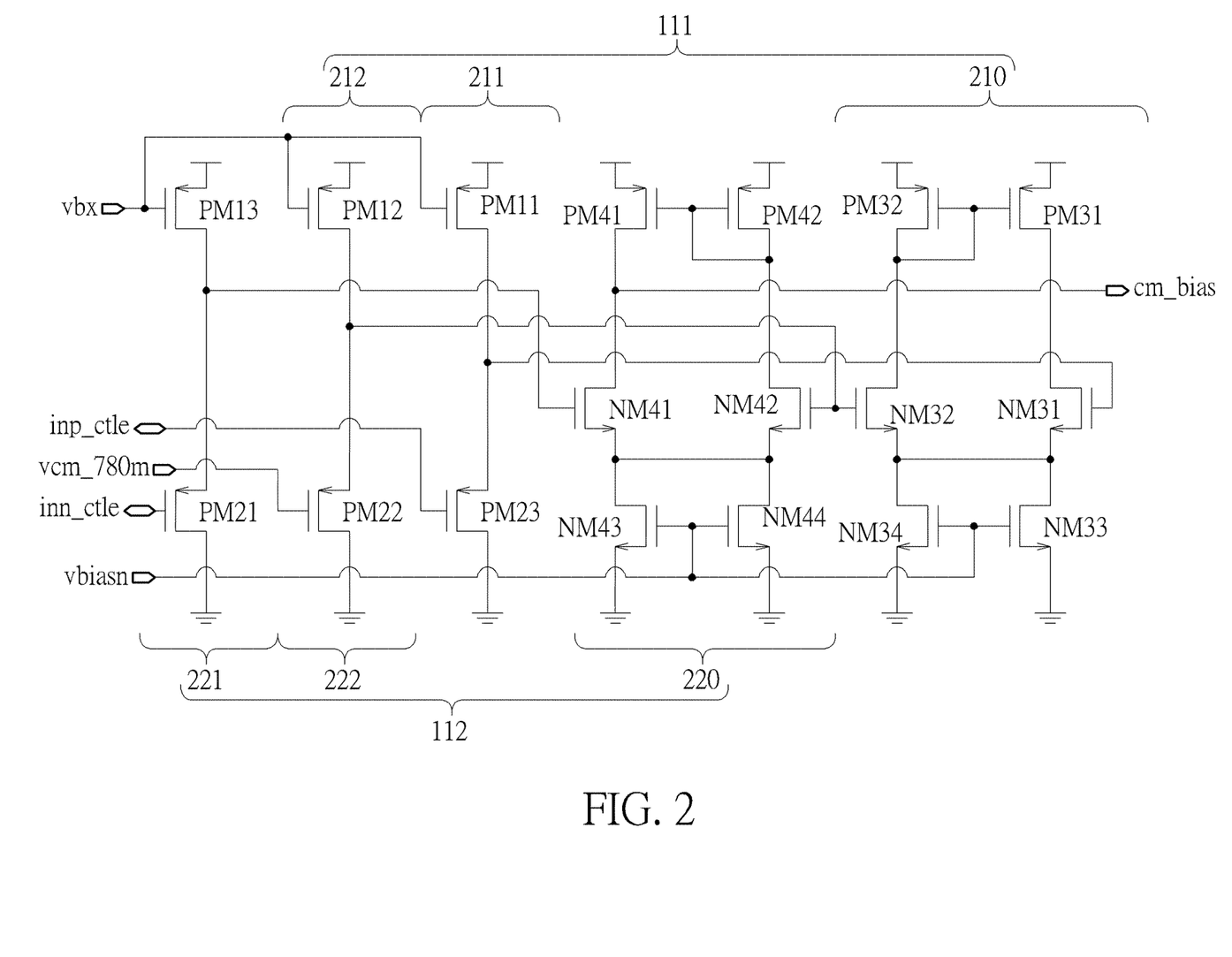
FIG. 2 illustrates implementation details of the common mode voltage generator shown in FIG. 1 according to an embodiment of the present invention.

FIG. 2 illustrates implementation details of the common mode voltage generator 110 shown in FIG. 1 according to an embodiment of the present invention. Each partial circuit of multiple partial circuits within the set of operational amplifier 111 and 112 may comprise multiple transistors, where the operational amplifier 111 may comprise a first set of partial circuits {210, 211, 212} within the multiple partial circuits, and the operational amplifier 112 may comprise a second set of partial circuits {220, 221, 222} within the multiple partial circuits. For example, the partial circuit 210 may comprise transistors {PM31, PM32, NM31, NM32, NM33, NM34}, the partial circuit 211 may comprise transistors {PM11, PM23}, and the partial circuit 212 may comprise transistors {PM12, PM22}. For another example, the partial circuit 220 may comprise transistors {PM41, PM42, NM41, NM42, NM43, NM44}, the partial circuit 221 may comprise transistors {PM13, PM21}, and the partial circuit 222 may comprise the transistors {PM12, PM22}. As shown in FIG. 2, the partial circuit 222 may be equal to the partial circuit 212. The operational amplifier 111 and 112 may share a partial circuit (the partial circuit 212 or 222) within the multiple partial circuits, where each set of the first set of partial circuits {210, 211, 212} and the second set of partial circuits {220, 221, 222} may comprise the partial circuit. As a result, a chip area corresponding to the common mode generator 110 can be reduced. In addition, a voltage level vbx on a terminal vbx may be a predetermined voltage level, and a voltage level vbiasn on a terminal vbiasn may be another predetermined voltage level, but the present invention is not limited thereto.

Figure 3:
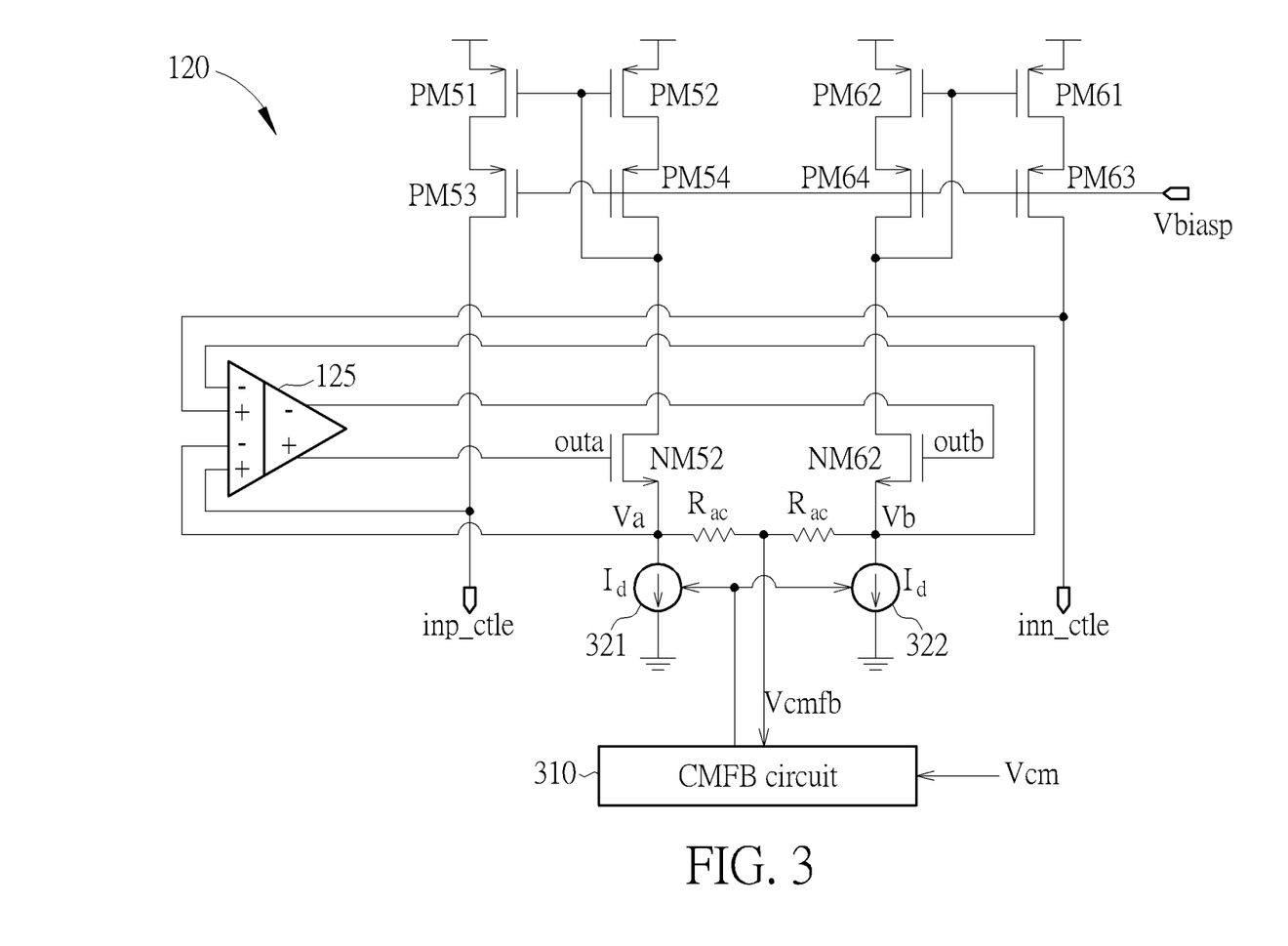
FIG. 3 illustrates implementation details of the baseline wander correction compensation circuit shown in FIG. 1 according to an embodiment of the present invention.

FIG. 3 illustrates implementation details of the BLWC compensation circuit 120 shown in FIG. 1 according to an embodiment of the present invention. The FDDA 125 may comprise four input terminals (such as two non-inverting input terminals labeled "+" and two inverting input terminals labeled "−", which are positioned on the left-side of the FDDA 125) and two output terminals (such as a non-inverting output terminal labeled "+" and an inverting output terminal labeled "−", which are positioned on the right-side of the FDDA 125). In addition to the FDDA 125, the BLWC compensation circuit 120 may comprise a feedback control circuit such as a common mode feedback (CMFB) circuit 310, a set of current sources 321 and 322, a set of resistors {$R_{ac}$} (which may have the same resistance $R_{ac}$) and a plurality of transistors {PM51, PM52, PM53, PM54, PM61, PM62, PM63, PM64, NM52, NM62}, where these transistors {PM51, PM52, PM53, PM54, PM61, PM62, PM63, PM64, NM52, NM62} may be arranged to provide the multiple current paths associated with each other.

For example, in addition to the first current path and the second current path, the multiple current paths may further comprise a third current path and a fourth current path. The first current path may pass through the transistors {PM51, PM53} and may be positioned on a first branch that comprises the transistors {PM51, PM53}. The second current path may pass through the transistors {PM61, PM63} and may be positioned on a second branch that comprises the transistors {PM61, PM63}. The third current path may pass through the transistors {PM52, PM54, NM52} and the current source 321 and may be positioned on a third branch that comprises the transistors {PM52, PM54, NM52} and the current source 321. The fourth current path may pass through the transistors {PM62, PM64, NM62} and the current source 322 and may be positioned on a fourth branch that comprises the transistors {PM62, PM64, NM62} and the current source 322. The set of current sources 321 and 322 may be respectively positioned on the third current path and the fourth current path, and more particularly, may control the respective currents $I_d$ of the third current path and the fourth current path, where the set of current sources 321 and 322 may be designed as current sources having the same current $I_d$, and any slight difference caused by mismatch (if exists) may be within a predetermined allowable range, and therefore may be omitted. The set of resistors {$R_{ac}$} are connected to each other in series and coupled between the third current path and the fourth current path, and more particularly, the set of resistors {$R_{ac}$} may provide a feedback signal (such as a voltage level Vcmfb, which may be an average voltage level of voltage levels va and vb) on a terminal between the set of resistors {$R_{ac}$}. The feedback control circuit such as the CMFB circuit 310 is coupled to the terminal between the set of resistors {$R_{ac}$} and coupled to the set of current sources 321 and 322, and more particularly, may control the set of current sources 321 and 322 according to the feedback signal (such as the voltage level Vcmfb), to control respective currents $I_d$ of the third current path and the fourth current path.

As shown in FIG. 3, the FDDA 125 is coupled to the multiple current paths and two transistors {NM52, MM62} through the four input terminals and the two output terminals, respectively, and more particularly, the FDDA 125 may control these two transistors {NM52, MM62} according to voltage levels on the multiple current paths, for example, by utilizing voltage levels outa and outb, where these two transistors {NM52, MM62} are positioned on the third current path and the fourth current path, respectively, and other transistors such as four sets of transistors {PM51, PM53}, {PM61, PM63}, {PM52, PM54} and {PM62, PM64} are positioned on the first current path, the second current path, the third current path and the fourth current path, respectively. According to this embodiment, a first input terminal within the aforementioned four input terminals (such as the lower non-inverting input terminal within the two non-inverting input terminals) is coupled to the capacitor $C_{acp}$ through the first current path and the second terminal of the capacitor $C_{acp}$, and a second input terminal within the aforementioned four input terminals (such as the upper non-inverting input terminal within the two non-inverting input terminals) is coupled to the capacitor $C_{acn}$ through the second current path and the second terminal of the capacitor $C_{acn}$. In addition, a voltage level vbiasp on a terminal vbiasp may be a predetermined voltage level, but the present invention is not limited thereto.

Based on the architecture shown in FIG. 3 (more particularly, the components and the inter-component connections), the CMFB circuit 310 may receive a reference voltage such as the voltage level Vcm, and compare the voltage level Vcmfb with the voltage level Vcm, to selectively pull up or pull down the voltage level Vcmfb through controlling the set of current sources 321 and 322, to make the voltage level Vcmfb approach or reach the voltage level Vcm, but the present invention is not limited thereto.

According to some embodiments, the aforementioned input common mode voltage (such as the voltage level Vcm) may be regarded as a bias voltage of the BLWC compensation circuit 120, and the BLWC compensation circuit 120 may perform compensation according to the input common mode voltage (such as the voltage level Vcm) to reduce or eliminate the baseline wander effect. For example, the apparatus may generate a common mode voltage within a predetermined input common mode range. In addition, the BLWC compensation circuit 120 may utilize a current mirror that generates additional current, to charge or discharge AC coupling capacitors (such as the capacitors $C_{acp}$ and $C_{acn}$) to perform compensation. For example, the BLWC compensation circuit 120 may discharge the capacitor $C_{acn}$ while charging the capacitor $C_{acp}$. For another example, the BLWC compensation circuit 120 may charge the capacitor $C_{acn}$ while discharging the capacitor $C_{acp}$. As a result, the BLWC compensation circuit 120 can reduce or eliminate the baseline wander effect.

Figure 4:
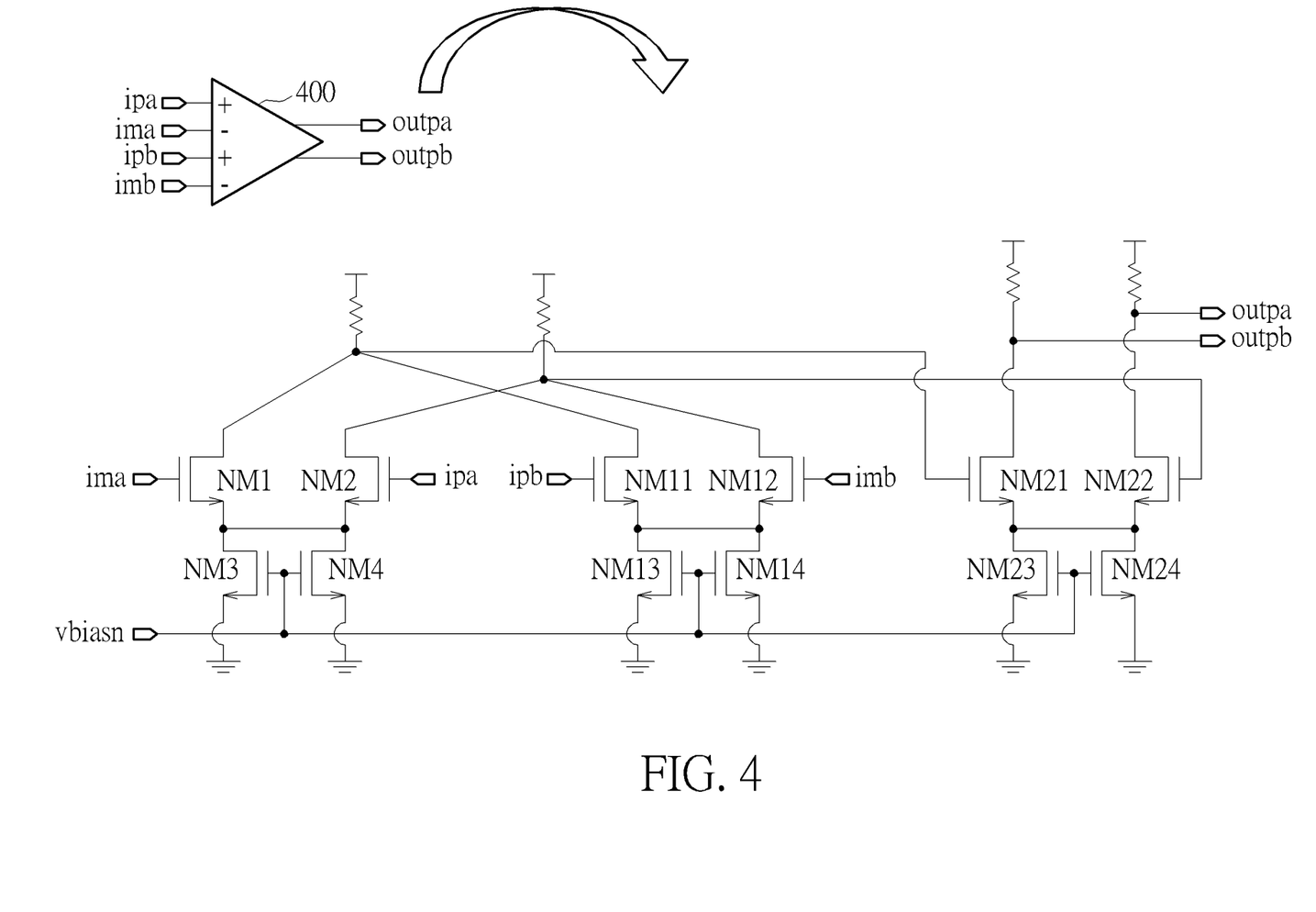
FIG. 4 is a diagram illustrating a fully differential difference amplifier (FDDA) according to an embodiment of the present invention, where the FDDA may be taken as an example of an FDDA shown in FIG. 3.

FIG. 4 is a diagram illustrating a FDDA 400 according to an embodiment of the present invention, where the FDDA 400 may be taken as an example of the FDDA 125 shown in FIG. 3. For example, terminals {ipa, ima, ipb, imb} may respectively represent the four input terminals of the FDDA 125 from bottom to top as shown in FIG. 3, and terminals {outpa, outpb} may respectively represent the two output terminals of FDDA 125 from bottom to top as shown in FIG. 3. In this situation, the terminals outpa and outpb may output the voltage levels outa and outb, respectively. The lower half of FIG. 4 illustrates an example of circuit architecture of the FDDA 400. The FDDA 400 may comprise three sets of transistors {NM1, NM2, NM3, NM4}, {NM11, NM12, NM13, NM14} and {NM21, NM22, NM23, NM24}, but the present invention is not limited thereto.

Figure 5:
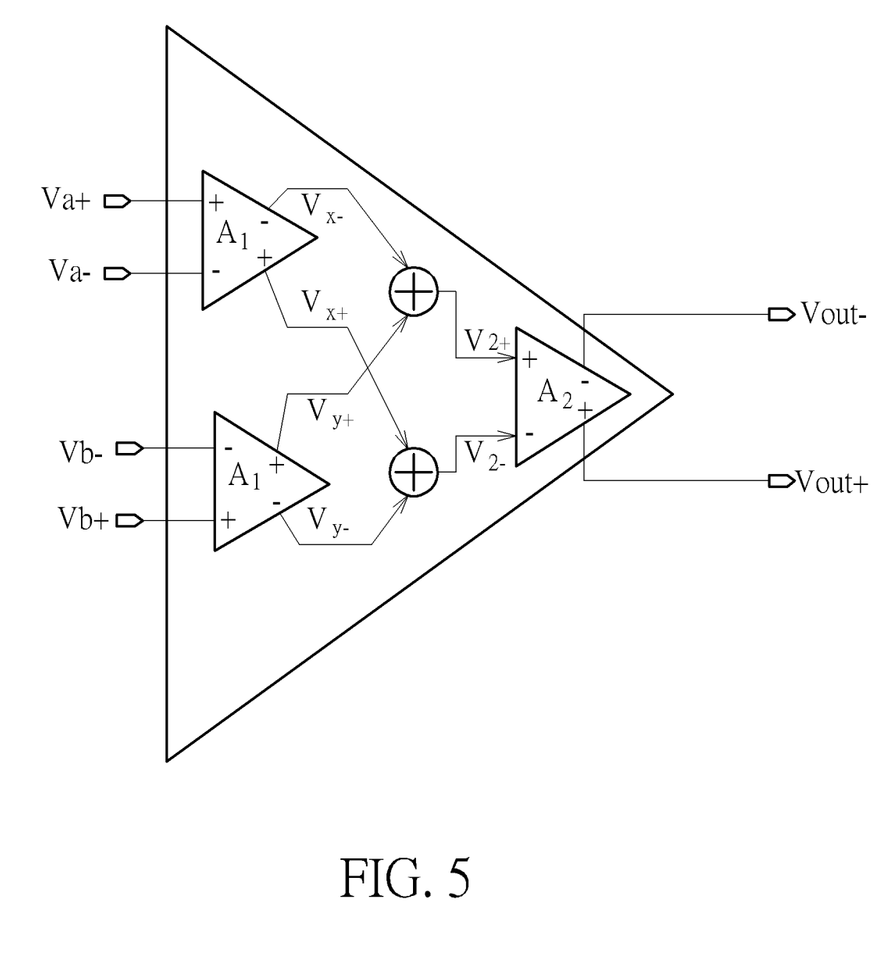
FIG. 5 illustrates implementation details of the FDDA shown in FIG. 4 according to an embodiment of the present invention.

FIG. 5 illustrates implementation details of the FDDA 400 shown in FIG. 4 according to an embodiment of the present invention. The terminals {ipa, ima, ipb, imb} may receive voltage levels {Va+, Va−, Vb+, Vb−}, respectively, and the terminals {outpa, outpb} may output voltage levels {Vout−, Vout+}, respectively, but the present invention is not limited thereto. As shown in FIG. 5, the FDDA 400 may comprise a set of first amplifiers having the same gain $A_1$, a second amplifier having a gain $A_2$, and a set of adders (illustrated with circles labeled "+" therein), where the set of first amplifiers output voltage levels {$V_{x-}$, $V_{x+}$} and {$V_{y+}$, $V_{y-}$}, respectively, and the set of adders output voltage levels $V_{2+}$ and $V_{2-}$, respectively. According to this embodiment, operations of the FDDA 400 may be expressed with the following equations:

$$Vout = Vout+ - Vout- = A_2 \times (V_{2+} - V_{2-});$$

$$V_x = V_{x+} - V_{x-} = A_1 \times (Va+ - Va-);$$

$$V_y = V_{y+} - V_{y-} = A_1 \times (Vb+ - Vb-);$$

$$V_{2+} = V_{x-} + V_{y+};$$

$$V_{2-} = V_{x+} + V_{y-};$$

where Vout, $V_x$ and $V_y$ represent differences between respective differential signals of the second amplifier, the upper first amplifier (i.e. the upper one of the set of first amplifiers) and the lower first amplifier (i.e. the lower one of the set of first amplifiers), respectively. The above equations may be arranged as follows:

$$Vout = A_1 \times A_2 \times [(Vb+ - Va+) - (Vb- - Va-)];$$

but the present invention is not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for performing baseline wander correction, the apparatus being applicable to a front-end circuit of a receiver, the apparatus comprising:
    a plurality of filters, positioned in the front-end circuit and coupled to a set of input terminals of the receiver, arranged to filter a set of input signals on the set of input terminals to generate a set of differential signals on a set of secondary terminals, for further use of the receiver;
    a common mode voltage generator, positioned in the front-end circuit and electrically connected to the set of secondary terminals, arranged to generate a common mode voltage between the set of differential signals; and
    a compensation circuit, positioned in the front-end circuit and electrically connected to the set of secondary terminals, arranged to perform compensation related to baseline wander correction on the set of differential signals, wherein multiple current paths of the compensation circuit are associated with each other, and through a first current path and a second current path within the current paths, the compensation circuit perform charge or discharge control on a first capacitor and a second capacitor within the plurality of filters to dynamically adjust compensation amounts of the compensation, to reduce or eliminate a baseline wander effect of the set of differential signals.

2. The apparatus of claim 1, wherein the first capacitor is coupled between a first input terminal within the set of input terminals and a first secondary terminal within the set of secondary terminals, and the first capacitor has a first terminal and a second terminal that are coupled to the first input terminal and the first secondary terminal, respectively; the second capacitor is coupled between a second input terminal within the set of input terminals and a second secondary terminal within the set of secondary terminals, and the second capacitor has a first terminal and a second terminal that are coupled to the second input terminal and the second secondary terminal, respectively; and the first current path is coupled to the first capacitor through the second terminal of the first capacitor, and the second current path is coupled to the second capacitor through the second terminal of the second capacitor.

3. The apparatus of claim 2, wherein the first current path is coupled to the first capacitor through the second terminal of the first capacitor rather than through the first terminal of the first capacitor; and the second current path is coupled to the second capacitor through the second terminal of the second capacitor rather than through the first terminal of the second capacitor.

4. The apparatus of claim 1, wherein the compensation circuit comprises:
    a plurality of transistors, arranged to provide the multiple current paths associated with each other; and
    a fully differential difference amplifier (FDDA), coupled to the multiple current paths and two transistors through input terminals and output terminals of the FDDA, respectively, arranged to control the two transistor according to voltage levels on the multiple current paths, wherein the plurality of transistors comprise the two transistors.

5. The apparatus of claim 4, wherein in addition to the first current path and the second current path, the multiple current paths further comprise a third current path and a fourth current path; and the two transistors are positioned on the third current path and the fourth current path, respectively.

6. The apparatus of claim 5, wherein in addition to the two transistors, the plurality of transistors further comprise four sets of transistors; and the four sets of transistors are positioned on the first current path, the second current path, the third current path and the fourth current path, respectively.

7. The apparatus of claim 4, wherein the first capacitor is coupled between a first input terminal within the set of input terminals and a first secondary terminal within the set of secondary terminals, and the first capacitor has a first terminal and a second terminal that are coupled to the first input terminal and the first secondary terminal, respectively; the second capacitor is coupled between a second input terminal within the set of input terminals and a second secondary terminal within the set of secondary terminals, and the second capacitor has a first terminal and a second terminal that are coupled to the second input terminal and the second secondary terminal, respectively; and a first input terminal within the input terminals of the FDDA is coupled to the first capacitor through the first current path and the second terminal of the first capacitor, and a second input terminal within the input terminals of the FDDA is coupled to the second capacitor through the second current path and the second terminal of the second capacitor.

8. The apparatus of claim 4, wherein in addition to the first current path and the second current path, the multiple current paths further comprise a third current path and a fourth current path; and the compensation circuit comprises:

a set of current sources, positioned on the third current path and the fourth current path, respectively, arranged to control respective currents of the third current path and the fourth current path;

a set of resistors, connected to each other in series and coupled between the third current path and the fourth current path, arranged to provide a feedback signal on a terminal between the set of resistors; and a feedback control circuit, coupled to the terminal between the set of resistors and coupled to the set of current sources, arranged to control the set of current sources according to the feedback signal, to control the respective currents of the third current path and the fourth current path.

9. The apparatus of claim 1, wherein the common mode voltage generator comprises:

a set of operational amplifiers, comprising a first operational amplifier and a second operational amplifier, wherein respective output terminals of the first operational amplifier and the second operational amplifier are electrically connected to each other and electrically connected to a common output terminal, respective first input terminals of the first operational amplifier and the second operational amplifier are electrically connected to each other and electrically connected to a reference voltage, and respective second input terminals of the first operational amplifier and the second operational amplifier are electrically connected to a first secondary terminal and a second secondary terminal within the set of secondary terminals, respectively; and a set of adjustment circuits, electrically connected to the first secondary terminal and the second secondary terminal, respectively, and electrically connected to the set of operational amplifiers through the common output terminal, arranged to apply the common mode voltage to the set of differential signals.

10. The apparatus of claim 9, wherein each partial circuit of multiple partial circuits within the operational amplifier comprises multiple transistors, the first operational amplifier comprises a first set of partial circuits within the multiple partial circuits, the second operational amplifier comprises a second set of partial circuits within the multiple partial circuits, and the first operational amplifier and the second operational amplifier share a partial circuit within the multiple partial circuits, wherein each set within the first set of partial circuits and the second set of partial circuits comprises the partial circuit.

* * * * *